US010751845B2

(12) United States Patent
Grund

(10) Patent No.: US 10,751,845 B2
(45) Date of Patent: Aug. 25, 2020

(54) SUPPORTING DEVICE FOR A PLURALITY OF COMPONENTS WITH DIFFERENT GEOMETRIES

(71) Applicant: Rehau AG + Co., Rehau (DE)

(72) Inventor: Bernd Grund, Hof (DE)

(73) Assignee: Rehau AG + Co., Rehau (DE)

( * ) Notice: Subject to any disclaimer, the term of this patent is extended or adjusted under 35 U.S.C. 154(b) by 55 days.

(21) Appl. No.: 15/775,134

(22) PCT Filed: Oct. 24, 2016

(86) PCT No.: PCT/EP2016/001760
§ 371 (c)(1),
(2) Date: May 10, 2018

(87) PCT Pub. No.: WO2017/080630
PCT Pub. Date: May 18, 2017

(65) Prior Publication Data
US 2018/0243867 A1 Aug. 30, 2018

(30) Foreign Application Priority Data

Nov. 12, 2015 (DE) .................... 20 2015 106 116 U

(51) Int. Cl.
*B23G 1/00* (2006.01)
*B23Q 1/03* (2006.01)
(Continued)

(52) U.S. Cl.
CPC .............. *B23Q 1/035* (2013.01); *B25B 11/00* (2013.01); *B23Q 3/00* (2013.01); *B23Q 7/00* (2013.01);
(Continued)

(58) Field of Classification Search
CPC . B23Q 1/035; B23Q 3/00; B23Q 7/00; B23Q 35/10; B25B 11/00; H05K 13/00; F16J 15/46; B27C 5/00
(Continued)

(56) References Cited

U.S. PATENT DOCUMENTS

| 5,457,868 A | 10/1995 | Blaimschein | |
|---|---|---|---|
| 2009/0126187 A1* | 5/2009 | Kajiyama | B23Q 1/035 29/760 |
| 2009/0140482 A1* | 6/2009 | Saberton | B23Q 1/035 269/296 |

FOREIGN PATENT DOCUMENTS

| EP | 0400765 | 12/1990 |
|---|---|---|
| WO | 2008001654 | 1/2008 |
| WO | 2015019210 | 2/2015 |

OTHER PUBLICATIONS

Translation of International Search Report dated Feb. 17, 2017.
(Continued)

*Primary Examiner* — Lee D Wilson
*Assistant Examiner* — Katina N. Henson
(74) *Attorney, Agent, or Firm* — Preston Smirman; Smirman IP Law, PLLC

(57) ABSTRACT

The invention relates to a supporting device for a plurality of components (100, 200, 100*) with different geometries, in particular for a plurality of geometrically different motor-vehicle external attachments made of polymer material, having a support frame (30), a drive (40) arranged on the support frame (30) and at least two supporting groups (1, 2, 3, 4, 5) arranged on the support frame (30), wherein each supporting group (1, 2, 3, 4, 5) serves as a supporting surface for a particular component geometry, wherein each supporting group (1, 2, 3, 4, 5) has at least two spaced-apart, disc-shaped supporting elements (1', 1", 1'''; 2', 2", 2''', etc.), the upwardly facing rim (10', 10", 10'''; 20', 20",
(Continued)

20''', etc.) of each of which already has, in the unloaded state, a contour adapted to the geometry of the associated component (100, 200, 100*). By means of the drive (40), the supporting elements (1', 1'', 1'''; 2', 2'', 2''', etc.) are movable such that only the supporting elements (1', 1'', 1'''; 2', 2'', 2''', etc.) of a single supporting group (1, 2, etc.) protrude upwards such that the upwardly facing rims (10', 10'', 10'''; 20', 20'', 20''', etc.) thereof form the supporting surface for the component geometry associated therewith.

11 Claims, 7 Drawing Sheets

(51) Int. Cl.
  *B25B 11/00*   (2006.01)
  *B25B 1/24*    (2006.01)
  *B23Q 7/00*    (2006.01)
  *H05K 13/00*   (2006.01)
  *B23Q 3/00*    (2006.01)
  *B27C 5/00*    (2006.01)
  *F16J 15/46*   (2006.01)

(52) U.S. Cl.
  CPC ............... *B25B 1/2421* (2013.01); *B27C 5/00* (2013.01); *F16J 15/46* (2013.01); *H05K 13/00* (2013.01)

(58) Field of Classification Search
  USPC ........ 269/14, 21, 266, 75; 29/760, 729, 559; 277/583
  See application file for complete search history.

(56) References Cited

OTHER PUBLICATIONS

International Search Report dated Feb. 17, 2017.
International Preliminary Report on Patentability dated May 15, 2018.
Translation of Written Opinion of the International Searching Authority dated Feb. 17, 2017.
Written Opinion of the International Searching Authority dated Feb. 17, 2017.
English Abstract of EP0400765.

* cited by examiner

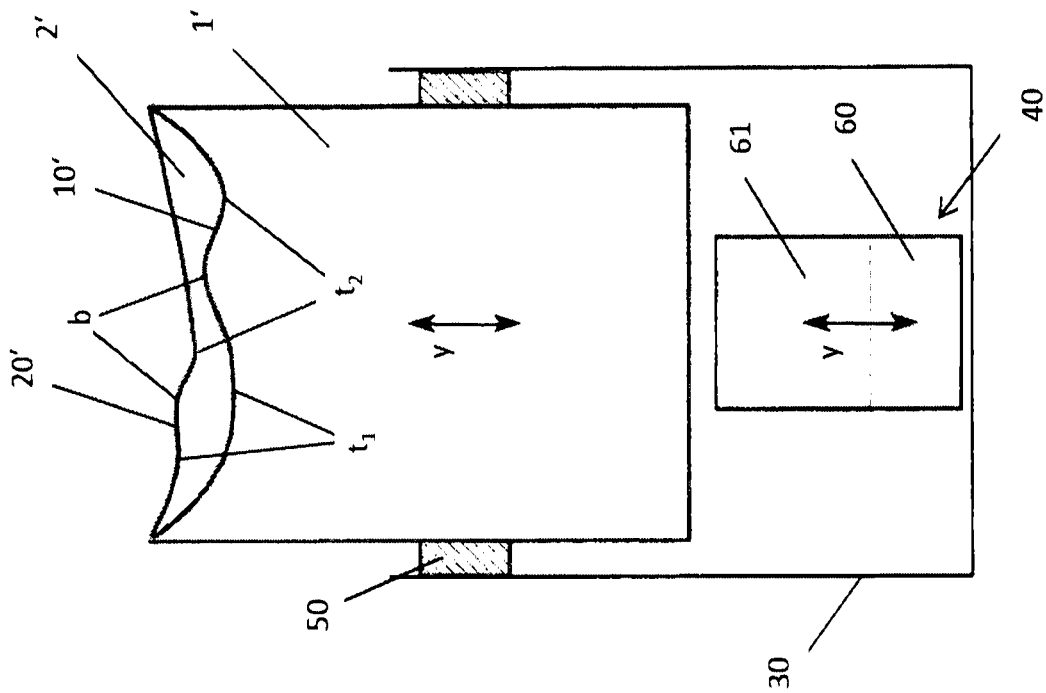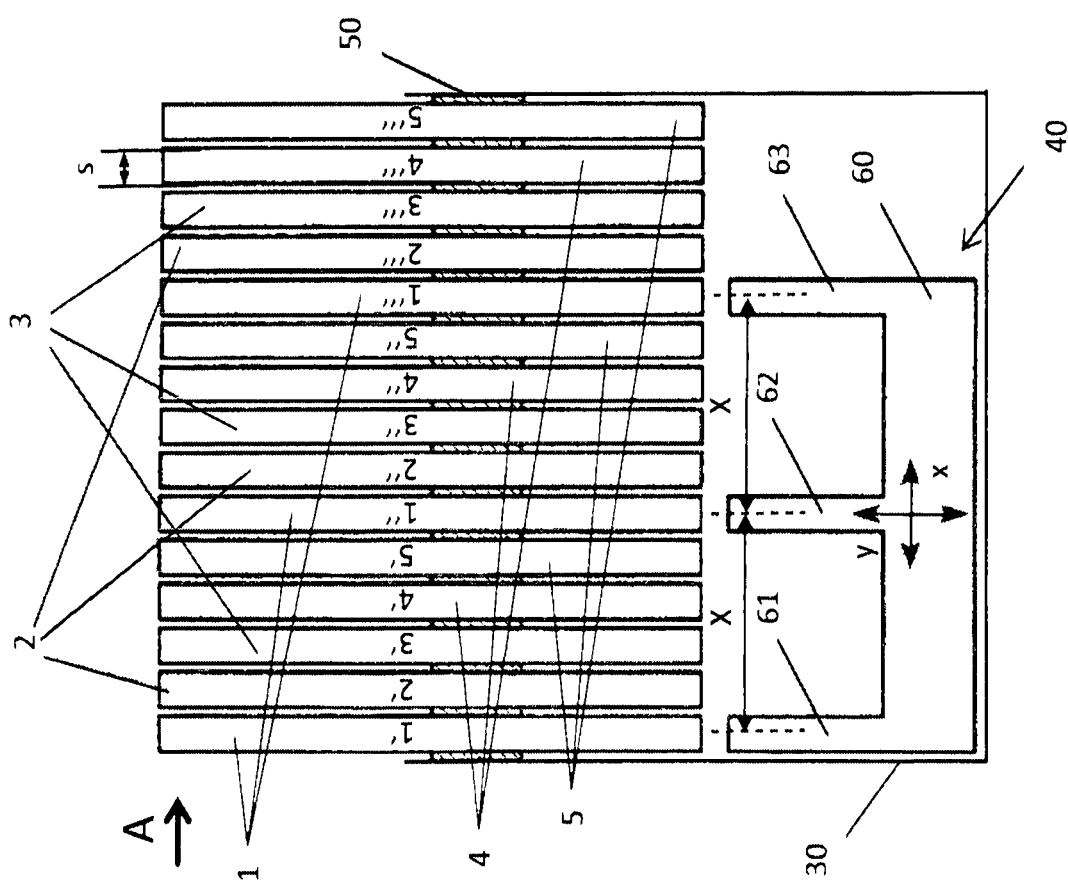

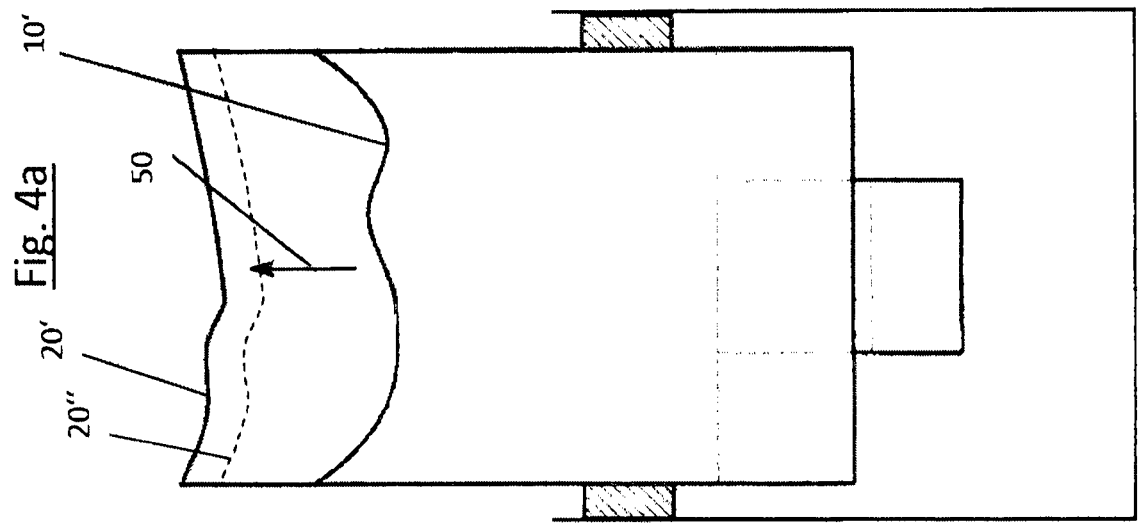
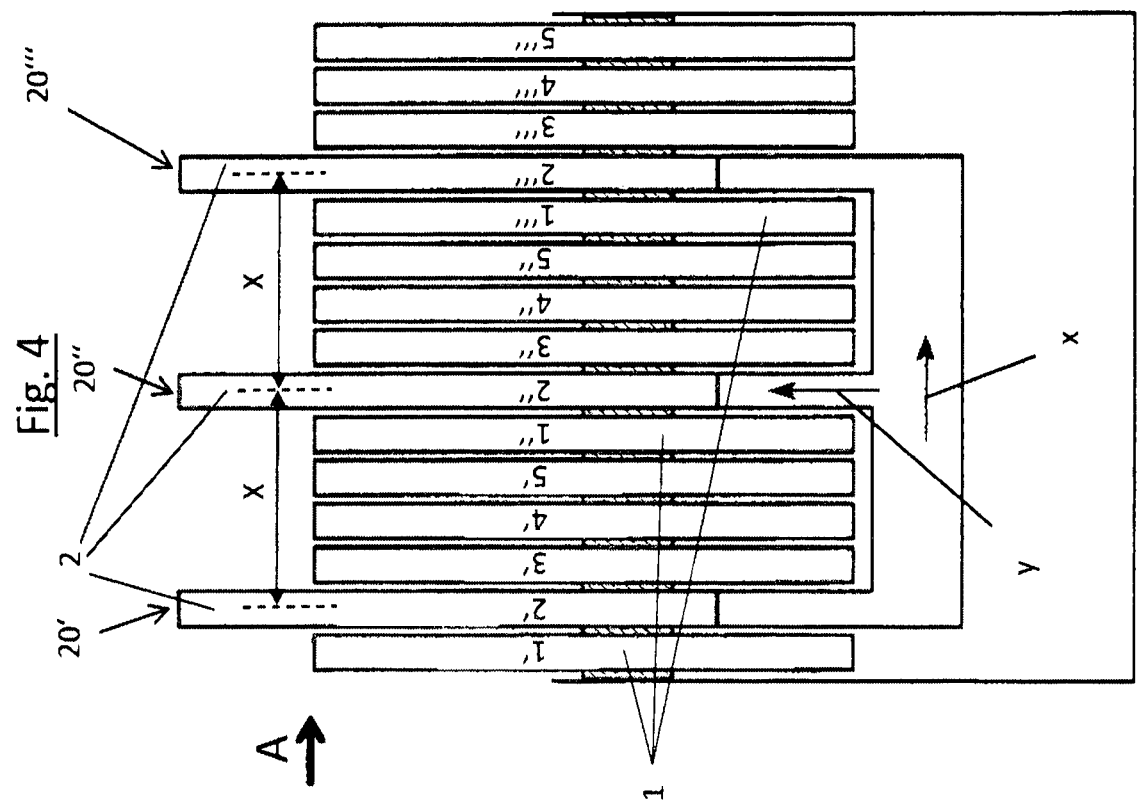

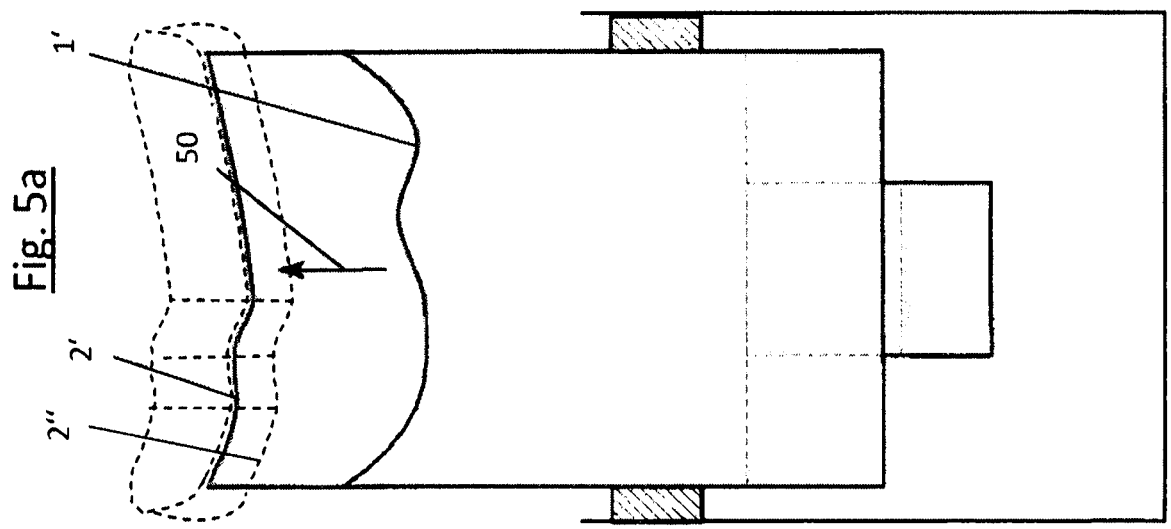
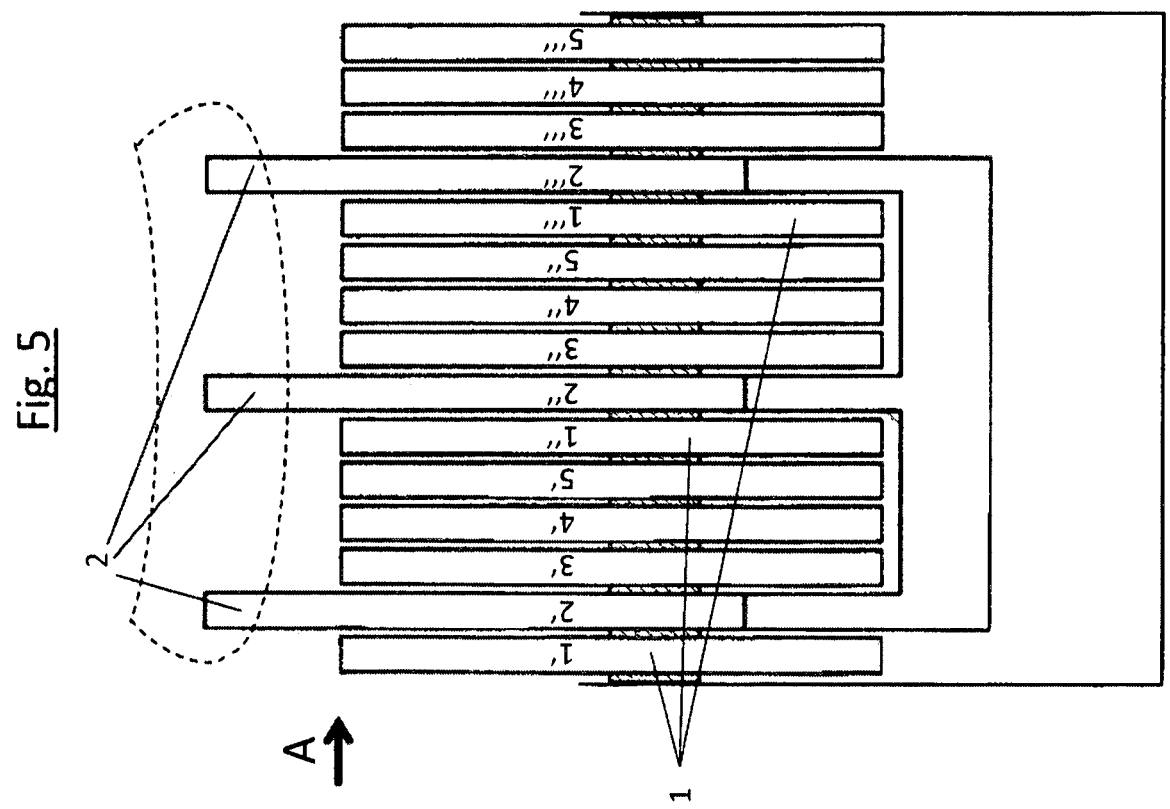

SUPPORTING DEVICE FOR A PLURALITY OF COMPONENTS WITH DIFFERENT GEOMETRIES

CROSS-REFERENCE TO RELATED APPLICATION

The instant application is a national phase of PCT International Application No. PCT/EP2016/001760 filed Oct. 24, 2016, and claims priority to German Patent Application Serial No. 202015106116.1 filed Nov. 12, 2015, the entire specifications of both of which are expressly incorporated herein by reference.

The invention relates to a support device for a plurality of components of different geometry, in particular, for a plurality of geometrically different motor vehicle exterior attachment components made of polymeric material. However, these motor vehicle exterior attachment components can also, for example, be longitudinal chassis beams, for example, door sills or spoilers. Preferably the motor vehicle exterior attachment components are applied in the already painted state to the support device. Increasingly, electronic elements, such as, for example, parking sensors, spacers and the like or else even washing units in particular for cleaning headlamps, are retrofitted in these components. For this purpose, the exterior attachment components preferably produced by injection molding must be securely positioned on a support, so that a flawless assembly of the additional components can be ensured.

In the prior art it is known to apply the components to deformable cushions filled preferably with air, which are then adapted under the load to the exterior geometry of the component. However, if components of different geometry must be subjected to one of the above assembly operations, such support devices are only partially suitable due to their limited adaptability. In the prior art a special support device is frequently kept in stock for each component geometry. However, this is cost-intensive and in addition leads to a large space requirement in the factory hall. Due to the ever increasing competitive pressure the need exists to be able to carry out the positioning of such components with different geometry in order to perform the assembly operations quickly, flawlessly and in a space-saving manner.

Against this background the problem addressed by the invention is to provide a support device of the type described at the outset, which makes possible a flawless fit of the components with significantly different geometries.

This problem is solved according to the present invention by a support device for a plurality of components of different geometry, in particular, for a plurality of geometrically different motor vehicle exterior attachment components made from polymeric material, with
a support frame,
a drive arranged on the support frame and
at least two support groups arranged on the support frame, wherein each support group is used for a specific component geometry,
wherein each support group has at least two disc-shaped support elements spaced apart from one another, the upwardly pointing edge of which already has a contour adapted to the geometry of the assigned component in the unloaded state and wherein by means of the drive the support elements can be moved in such a manner that only the support elements of a single support group project upwards, so that their upwardly pointing edges form the support surface for the internally assigned component geometry.

According to the present invention, a support group in the form of a plurality of support elements is produced for each concrete component geometry in such a manner that at its position on the support device its upper edge in each case is precisely adapted to the corresponding component geometry. By actuating the drive, only the support elements of a single support group are advantageously displaced upwards in such a manner that when the component is supported, all of the support elements of all other support groups do not come in contact with the component and thus the support surface for the concrete component alone is formed by the upper edges of the support elements, which are adapted precisely to the concrete component. The support elements and thus also accordingly their upper edge advantageously have a thickness in each case of 0.5-10 cm, preferably 1-2 cm.

Alternately, in each case only the support elements of a single support group can now always be jointly displaced upwards such that they form a support surface optimally matched to the concrete component. Since the disc-shaped support elements are adapted already in the unloaded state to the geometry of the assigned component, when the corresponding component is supported no elastic deformation of the support element is required in order to ensure an optimal fit. This increases the position accuracy of the concrete component on the support device, so that an optimal condition for a flawless assembly of additional components is given to the component. Advantageously, the support elements are therefore designed to be rigid. Preferably, the contours of adjacent support elements of different support groups differ already in the unloaded state due to their adaptation to different component geometries. A very precise, exactly defined fit of the concrete component can hereby be ensured on the support surface formed exclusively by the corresponding support elements.

Advantageously, at least three support groups are provided. Accordingly, in this case at least three different component geometries with exact fit can be placed on the support device. Of course, depending on the requirements more than three support groups are also within the scope of the invention. Preferably, each support group has at least three support elements spaced apart from one another, preferably at least six support elements spaced apart from one another. Advantageously, each support element therefore forms a single surface and the totality of all of these individual surfaces forms the support surface for the concrete component, to which these support elements are adapted.

Preferably, the upwardly pointing edge of a support element in a side view has a hill-and-valley profile with at least one hill and a least one valley. With this contour, the generally quite complex geometry of the component to be applied is taken into account; the contour of the upper edge of the support elements corresponds virtually to an impression of the component assigned to it at the respective support location. Advantageously, between two support elements of the same support group at least one support element of another support group is arranged. The support elements are advantageously alternatingly arranged along the component behind one another in a row, so that the distances between the individual support elements of one support group are the same for all support groups. Advantageously, the support elements are arranged in a row along side one another. It is also within the scope of the invention that the support elements are aligned parallel to one another at least in some areas.

According to a preferred embodiment of the invention the support frame has an angle shape adapted to a curvature of the components to be applied with at least two frame sections aligned angularly relative to one another, wherein on each of said frame sections at least one support group is arranged. This makes it possible in particular to support even large components, in particular, motor vehicle bumpers, according to their space curvature optimally on the support device. Advantageously, the support elements are aligned perpendicularly to the plane of their respective frame section, so that at least one support element of a support group is aligned at an angle to another support element of the same support group.

It is generally within the scope of the invention that the movement of the support elements is guided in a common guide device. The drive can have at least one carriage displaceable transversely to the alignment of the disc-shaped support elements with at least two upwardly projecting carriers spaced apart from one another in the direction of travel, by means of which only the support elements of a single support group can be lifted together. However, alternatively the drive can also have at least one camshaft, which can selectively in each case move all support elements of a single support group upwards, such that said support elements form the support surface for the concretely assigned component geometry.

Advantageously, a group of support elements of a support group is arranged offset by a constant distance to one group of support elements of another support group. It is hereby advantageously ensured that the carriers of the correspondingly positioned carriage in each case lift precisely only the support elements, which belong to a common support group. Then the distance mentioned corresponds precisely to the travel path, which the carriage has to take, in order to pass from the one to the other support group. It also is within the scope of the invention, that the drive is equipped with a motor. This is preferably designed as an electric, pneumatic or hydraulic motor.

The invention is elucidated in detail below by means of a drawing depicting only one embodiment.

FIG. 1: shows schematically a side view of a support device according to the present invention;

FIG. 1a shows schematically the view A in FIG. 1;

FIG. 4, 4a show schematically the support device depicted in FIGS. 1, 1a in a support position for a second component geometry, which differs from the first component geometry;

FIG. 5, 5a show schematically the depictions according to FIGS. 4, 4a with applied component;

Figure 2A:
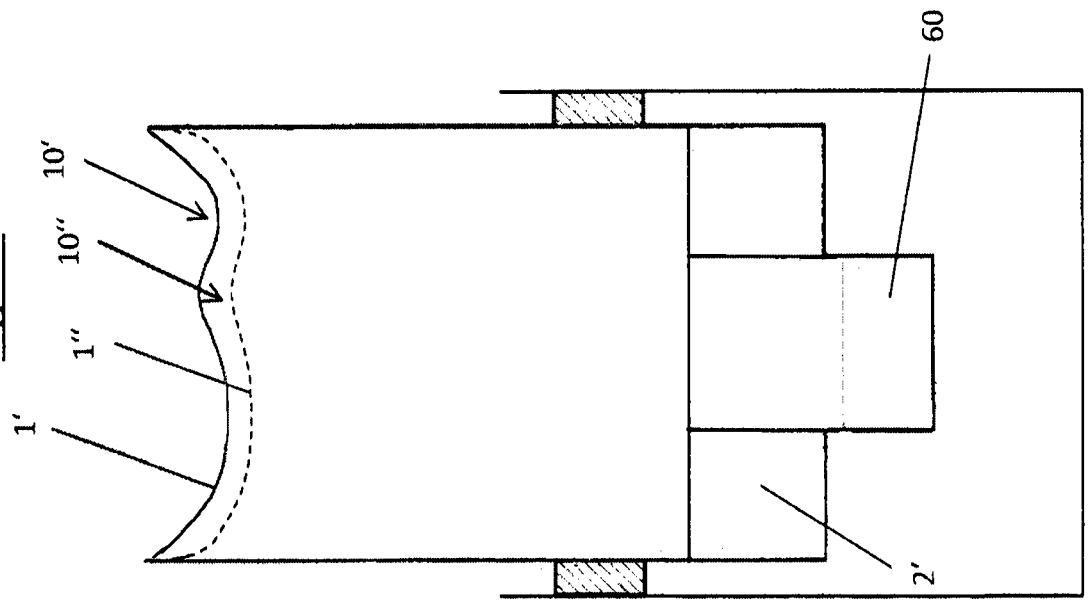
FIG. 2, 2a show schematically the support device depicted in FIGS. 1, 1a in a support position for a first component geometry.
Figure 2:
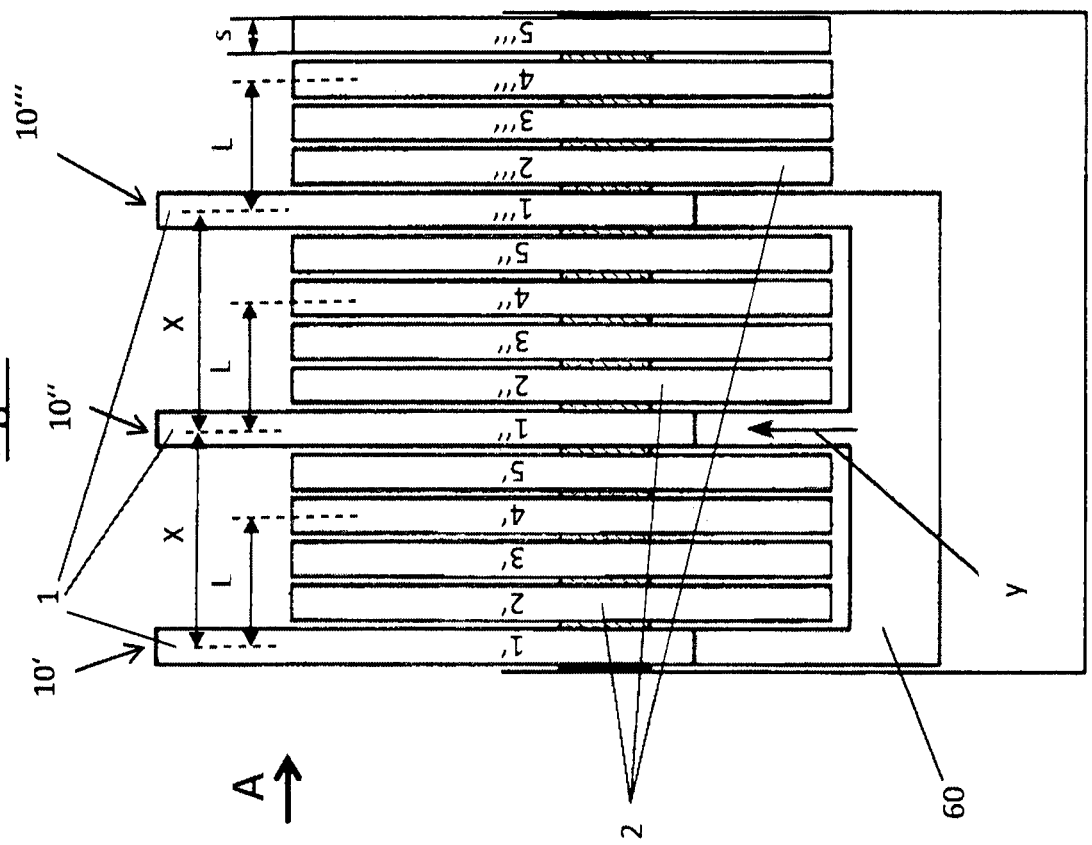
Figure 3A:
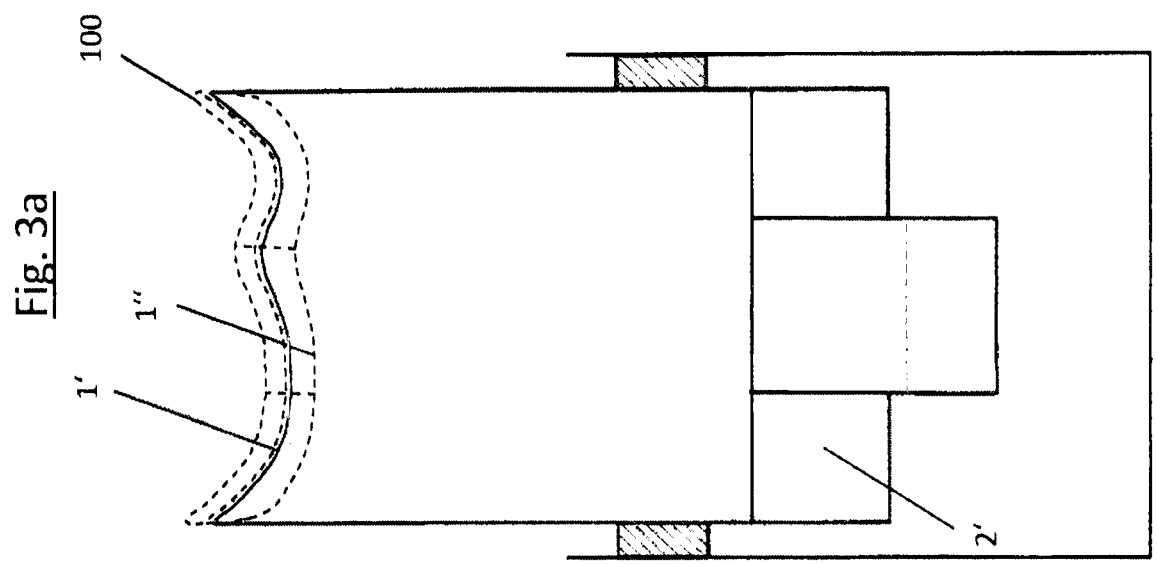
FIG. 3, 3a show schematically the depictions according to FIGS. 2, 2a with applied component.
Figure 3:
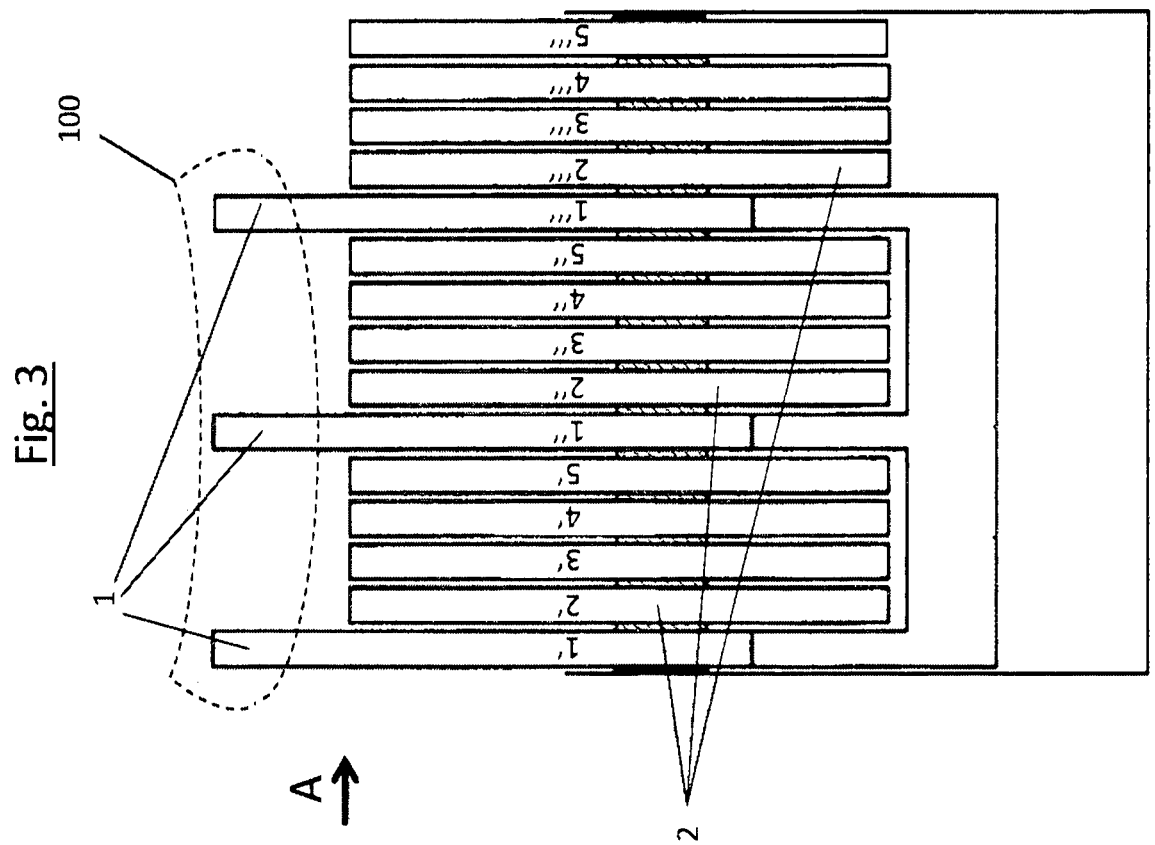
Figure 6:
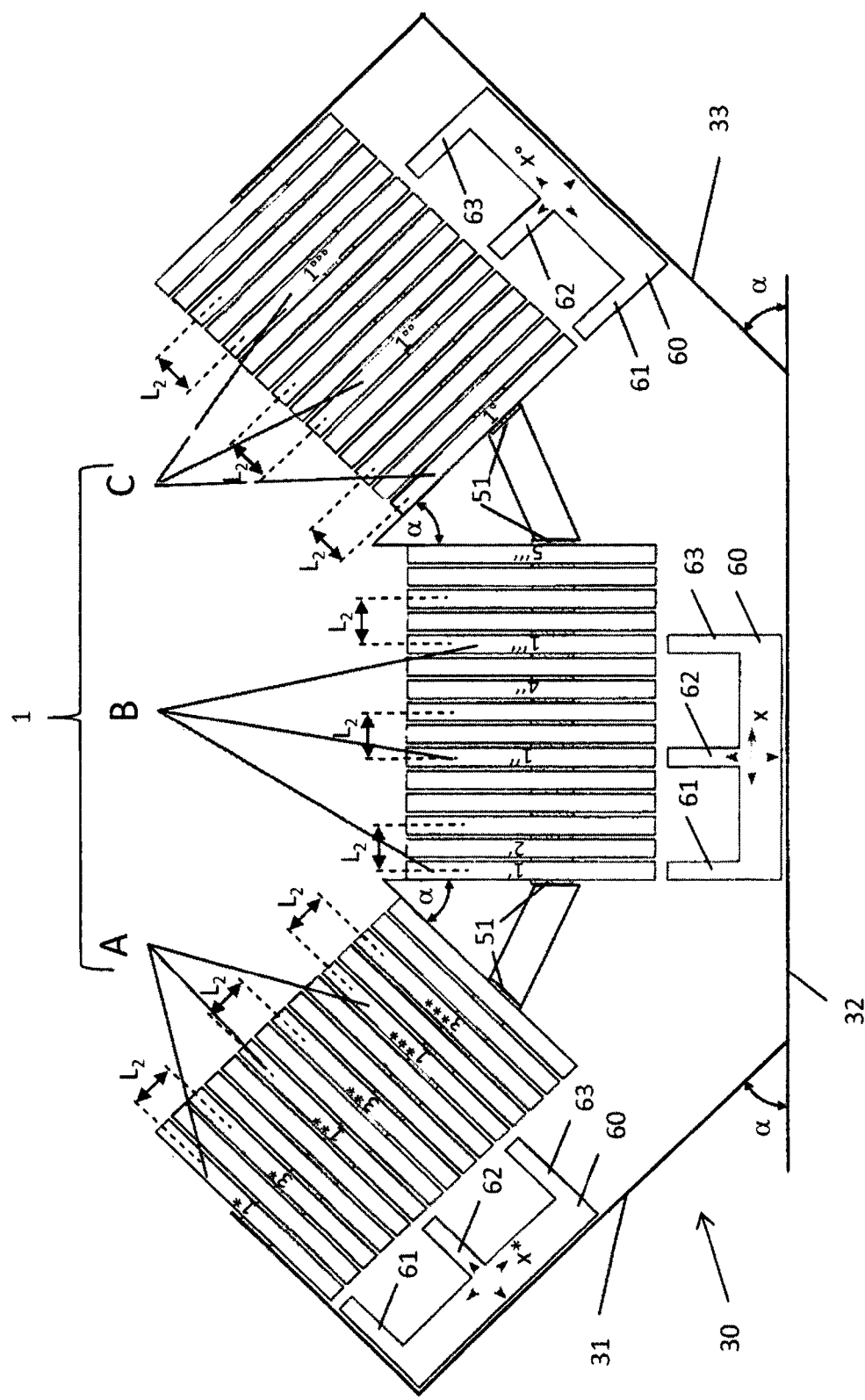
FIG. 6 shows schematically a further embodiment of the invention.
Figure 7:
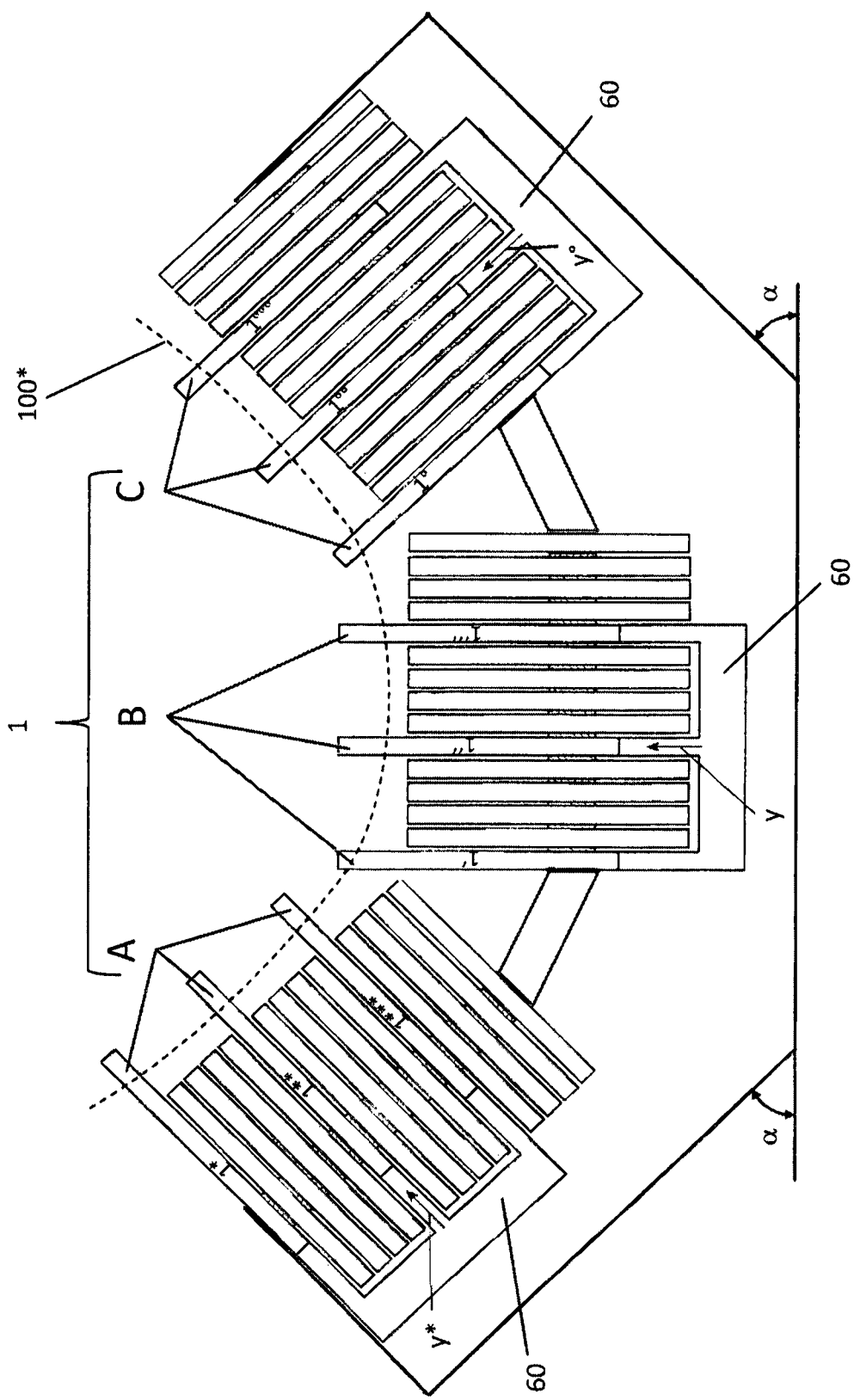

FIG. 7 shows schematically the depiction according to FIG. 6 with applied component FIGS. 1 to 5a show a support device for a plurality of geometrically different polymeric, already painted motor vehicle bumpers 100, 200, etc. Said support device is needed in order to assemble additional components on the corresponding motor vehicle bumpers 100, 200, etc, in particular, of an electrical nature, such as, for example, parking sensors, spacers or else also headlamp cleaning nozzles and the like. The support device has a support frame 30 made from metal, a drive 40 arranged on the support frame 30, and five support groups 1, 2, 3, 4, 5 arranged on the support frame 30. Each support group 1, 2, 3, 4, 5 is provided as a support surface for a specific bumper geometry.

As can be learned from the figures, each support group 1, 2, 3, 4, 5 has a total of three disc-shaped support elements 1', 1'', 1''' or 2', 2'', 2''' etc. spaced apart from one another, in each case upwardly pointing edge of which 10', 10'', 10''' or 20, 20', 20'' etc. already in the unloaded state has a contour adapted to the geometry of the assigned bumper 100 or 200, etc. The support elements 1', 1'', 1''' or 2', 2'', 2''' etc. consist of a material which can be easily cut, for example, a plastic and in each case has a thickness s of 1 to 2 centimeters. By means of the drive 40 the support elements 1', 1'', 1''' or 2', 2'', 2''' etc. are now movable in such a manner that only the support elements 1', 1'', 1''' or 2', 2'', 2''' etc. of a single support group 1, 2, 3, 4, 5 project upwards such that only the upwardly pointing edges 10', 10'', 10''' or 20', 20'', 20''' etc. of these support elements 1', 1'', 1''' or 2', 2'', 2''' etc. form the support surface for the motor vehicle bumper 100 or 200 etc. assigned to them. This becomes particularly clear by means of a consideration of FIGS. 3, 3a, 5, 5a.

It can also be seen in particular by means of FIG. 1a, that the contours of the edges 10', 20' etc. of adjacent support elements 1', 1'', 1''' or 2', 2'', 2''' etc. of different support groups 1, 2, 3, 4, 5 already differ from one another in the unloaded state due to their adaptation to different bumper geometries 100 or 200 etc. The support elements 1', 1'', 1' or 2', 2'', 2''' etc. are designed in the embodiment to be rigid. FIG. 1a shows that the upwardly pointing edge 10', 10'', 10''' or 20, 20', 20'' etc. of a support element 1', 1'', 1''' or 2', 2'', 2''' etc. in a side view has a hill-and-valley profile with a hill b and two valleys $t_1$, $t_2$. This hill-and-valley profile forms so to speak, an impression of the concrete motor vehicle bumper geometry at the corresponding support location (see FIGS. 3a and 5a). Depending on the complexity of the component 100, 200 etc. to be applied the profiles can also have both a plurality of hills as well as a plurality of valleys. The figures also show that between two support elements 1', 1'' or 1'', 1''' of the same group 1 in each case a support element 2', 3', 4', 5' or 2'',3'', 4'', 5'' of all other support groups 2, 3, 4, 5 is arranged. It can be seen that all support elements 1', 1'', 1''', 2', 2'', 2''' etc. are arranged in a row alongside one another and also all are aligned parallel to one another. All support elements 1', 1'', 1''' etc. of the support group 1 etc. are also arranged in this embodiment offset by the constant distance L to the support elements 4', 4'', 4''' etc. of another support group 4 etc. (see FIG. 2). This applies analogously to all support groups 1, 2, 3, 4, 5. The vertical movement of the support elements 1', 1'', 1''' etc. is guided in a common guide device 50.

The drive 40 now has transversely to the alignment of the disk-shaped support elements 1', 1'', 1''' etc. in the perpendicular y direction a carriage 60 displaceable in the horizontal direction x with three upwardly projecting carriers 61, 62, 63 spaced apart from one another in the direction of travel x, by means of which only the support elements 1', 1'', 1''' or 2', 2'', 2''' etc. of a single support group 1 or 2 or 3 or 4 or 5 can be lifted together in the vertical direction y. It can be seen by means of a comparative consideration of FIGS. 1, 2 and 4, that the center distance X of the individual carriers 61, 62, 63 in the direction of travel corresponds precisely to the center distance X between the individual support elements 1', 1'', 1''' or 2', 2'', 2''' etc. of each support group 1 or 2 etc. The center distance X between, for example, the two support elements 1', 1'' of the support group 1 therefore corresponds to the center distance X between the adjacent support elements 2', 2''' of the support group 2 and also the center distance X between the two carriers 61, 62, so that the carriage 60 with the upwardly projecting carriers 61, 62, 63 is suitable for a precision-fit entraining of all support elements 1', 1", 1''' or 2', 2", 2''' etc. of a support group 1 or 2 etc. It is also clear that the center distances X between the individual support elements 1', 1", 1''' or 2', 2", 2''' etc. of a support group 1 or 2 etc. are all the same size, therefore, for example, the center distance X between the two support elements 1', 1" is just as great as that between the support elements 1", 1'''. Correspondingly, the support elements 1', 1", 1''' or 2', 2", 2''' etc. and also the carriers 61, 62, 63 are uniformly spaced apart from one another along the travel path x. The drive 40 is equipped with a pneumatic motor (not depicted) driving the carriage 60, which can move the carriage 60 horizontally in the x direction and in the vertical direction y (indicated by the double arrow in FIG. 1).

The operation of the support device according to the present invention is now as follows: If a first bumper 100 should be applied to the support device, via the position of the carriage 60 the carriers 61, 62, 63 are positioned precisely underneath those support elements 1', 1", 1''', which together form the support group 1 and their upwardly pointing edge 10', 10", 10''' in each case is adapted locally precisely to the geometry of said first bumper 100 (see FIG. 2, 2a or 3, 3a). By a vertical lifting of the carriage 60 in the y direction these, and only these support elements 1', 1", 1''' are displaced upwards, so that only their upwardly pointing edges 10', 10", 10''' together form the support surface for the first bumper 100. In this upwardly displaced position the support elements 1', 1", 1''', are locked, for example, by the carriage, so that after this the first bumper 100 can be applied with accurate fit to the support group 1 and then can be processed.

If a second bumper 200 with a geometry deviating from the first bumper 100 is then applied to the support device, at first the carriage 60 is now moved downwards again in the y direction into its travel position and then is moved in the direction of travel x in such a manner that the carriers 61, 62, 63 are positioned directly underneath the support elements 2', 2", 2''' forming the support group 2, their upwardly pointing edges 20', 20", 20''' are adapted to the local geometry of said second bumper 200. Subsequently, the carriage 60 is lifted again in the y direction, so that now only the support elements 2', 2", 2''' are displaced upwards and only their upwardly pointing edges 20', 20", 20''' together form the support surface for the second bumper 200. Then said second bumper 200 can also be applied precision-fit to the support device. Since a total of five support groups 1, 2 3, 4, 5 are provided, accordingly five different bumper geometries can be applied to the support device depicted in FIGS. 1 to 5a.

FIGS. 6 and 7 show an alternative embodiment of the invention. In this embodiment the support frame 30 has an angle shape adapted to the curvature of a motor vehicle exterior attachment component 100* with three frame sections 31, 32, 33 angularly aligned with respect to one another. In the embodiment on the center frame section 32 in each case three support elements 1', 1", 1''' etc. and on the two outer frame sections 31, 33 also in each case three support elements 1*, 1, 1* or 1°, 1°°, 1°°° etc. of each support group 1 or 2 etc. are arranged (to facilitate an overview only the support elements of the support group 1 are all individually provided with reference numbers). In this connection, the two outer frame sections 31, 33 with the center frame section 32 in each case enclose the angle α>0, e.g. α=20÷60°. It is clear that the support elements 1*, 1, 1*, 1', 1", 1''', 1°, 1°°, 1°°° etc. are in each case aligned perpendicularly to the plane of their respective frame section 31, 32, 33, so that the support elements 1*, 1, 1* or 1°, 1°°, 1°°° etc. on the outer frame sections 31, 33 are aligned at the angle α to the support elements 1', 1", 1''' etc. on the center frame section 32. The movement of the support elements 1*, 1, 1*; 1', 1", 1'''; 1°, 1°°, 1°°° etc. is guided in a common guide device 51. It can be seen that in the embodiment according to FIGS. 6, 7, for example, the group A of support elements 1*, 1, 1* of the support group 1, which are arranged on the same frame section 31, are arranged offset by a constant distance $L_2$ to the group 3*, 3, 3* also arranged on said frame section 31 of support elements of the support group 3. This applies to the group B consisting of the support elements 1', 1", 1''' as well as the group C consisting of support 1°, 1°°, 1°°°. It should be noted that the basic structure of the group B in this embodiment corresponds to the basic structure of the entire group 1 in the embodiment according to FIGS. 1 to 5a. In FIGS. 6 and 7, however, the groups A, B and C depicted by way of example together form the support group 1. Furthermore, all support elements arranged on the same frame section 31, 32, 33 are arranged in a row alongside one another and are also all aligned in parallel to one another.

The operation of the support device shown in FIGS. 6, 7 is now analogous to the embodiment according to FIGS. 1-5 with the difference that here a separate carriage 60 is assigned to each frame section 31, 32, 33 and thus overall accordingly a total of three carriages 60 are provided for the selective lifting of the support elements 1*, 1', 1* etc. The carriages 60 can be driven by a common motor. Alternatively, however, a separate motor can also be provided for each carriage 60 (in each case not depicted). FIG. 6 shows a support device in the initial state and FIG. 7 shows the device with upwardly extended support elements 1*, 1', 1* as well as 1', 1", 1''' and 1°, 1°°, 1°°° and applied bumper 100*, wherein the mentioned support elements—as previously described—are in turn adapted to the local geometry of the bumper 100*. While the carriage 60 assigned to the center frame section 32 can in turn be moved horizontally in the x direction and is lifted or lowered in the vertical direction y, the carriages 60 assigned to the outer frame sections 31, 33 are moved offset correspondingly by the angle α. This means that the movement of these carriages 60 occurs obliquely to the horizontal x along the depicted directions x* or x° and the lifting or lowering of said carriages 60 occurs obliquely to the vertical y along the depicted directions y* or y°.

In the embodiments elucidated above a so-called internal assembly always occurs, that is, that the inside of the component—here of the bumper and thus also its curvature—points upwards and is freely accessible. Alternatively, it is also possible to design the support device, so that the outside of the components points upwards and is freely accessible. In the case of a curved component, for example, the bumper 100, 200, 100* depicted in the figures, in this case the curvature would point downwards and in an embodiment analogous to FIGS. 6 and 7 the center frame section would here project upwards, while the two outer frame sections drop correspondingly outwards, in order to adapt to the curvature of the bumper 100, 200, 100* pointing downwards.

The invention claimed is:

1. A support device for a plurality of components of different geometry, wherein a plurality of components include geometrically different motor vehicle exterior attachment components made from polymeric material, comprising:
- a support frame;
- a drive arranged on the support frame; and
- at least two support groups arranged on the support frame;
- wherein each support group serves as a support surface for a specific component geometry;
- wherein each support group has at least two disc-shaped support elements spaced apart from one another, wherein an upwardly pointing edge of each support element is already in an unloaded state has a contour adapted to the geometry of an assigned component;
- wherein, by means of the drive, the support elements are moved in such a manner that only the support elements of a single support group project upwards such that their upwardly pointing edges form the support surface for the component geometry assigned to them;
- wherein the contours of adjacent support elements of different support groups differ from one another in the unloaded state due to their adaptation to different component geometries;
- wherein at least three support groups are provided;
- wherein each support group has at least three support elements spaced apart from one another;
- wherein the upwardly pointing edge of a support element in a side view has a hill-and-valley profile with at least two hills and at least two valleys.

2. The support device according to claim 1, wherein the support elements are designed to be substantially rigid.

3. The support device according to claim 1, wherein between two support elements of the same support group, a support element of at least one other support group is arranged.

4. The support device according to claim 3, wherein the support elements are arranged in a row alongside of one another.

5. The support device according to claim 4, wherein the support elements are aligned parallel to one another at least in some areas.

6. The support device according to claim 5, wherein the support frame has an angle shape adapted to a curvature of the components to be applied with at least two frame sections aligned angularly with respect to one another, wherein on each of these frame sections at least one support element of each support group is arranged.

7. The support device according to claim 6, wherein the support elements are aligned at least substantially perpendicularly to the plane of their respective frame section, so that at least one support element of a support group is aligned at an angle to another support element of the same support group.

8. The support device according to claim 7, wherein the movements of the support elements are guided in a common guide device.

9. The support device according to claim 8, wherein the drive has at least one carriage displaceable transversely to the alignment of the disc-shaped support elements with at least two upwardly projecting carriers spaced apart from one another in the direction of travel, by means of which only the support elements of a single support group can be lifted together.

10. The support device according to claim 9, wherein a group of support elements of one support group is arranged offset by a constant distance to a group of support elements of another support group.

11. The support device according to claim 10, wherein the drive is equipped with an electric, pneumatic or hydraulic motor.

* * * * *